United States Patent
Yamamoto

(10) Patent No.: US 6,721,017 B2
(45) Date of Patent: Apr. 13, 2004

(54) TELEVISION TUNER'S INTERMEDIATE FREQUENCY TUNING CIRCUIT CAPABLE OF RECEIVING FM BROADCAST SIGNALS

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 439 days.

(21) Appl. No.: 09/862,239

(22) Filed: May 22, 2001

(65) Prior Publication Data

US 2001/0048487 A1 Dec. 6, 2001

(30) Foreign Application Priority Data

May 26, 2000 (JP) ......................................... 2000-161160

(51) Int. Cl.[7] .............................. H04N 5/46; H04N 5/50
(52) U.S. Cl. ....................................... 348/729; 348/731
(58) Field of Search ................................. 348/725, 728, 348/729, 731, 732, 733; 455/169.2, 180.4, 182.3, 191.1, 191.2, 191.3, 192.3, 193.3, 187.1, 188.1, 189.1, 314, 176.1, 168.1, 178.1; 334/266, 14, 15, 18, 42, 47, 52, 48, 64; H04N 5/46, 5/50

(56) References Cited

U.S. PATENT DOCUMENTS

| | | |
|---|---|---|
| 4,363,135 A | 12/1982 | Moon |
| 4,368,541 A * | 1/1983 | Evans ...................... 455/187.1 |
| 4,399,559 A * | 8/1983 | Theriault ................. 455/182.3 |
| 5,577,270 A | 11/1996 | Sakai |
| 6,169,912 B1 * | 1/2001 | Zuckerman ................. 455/570 |
| 6,351,294 B1 * | 2/2002 | Yamamoto et al. ......... 348/731 |

FOREIGN PATENT DOCUMENTS

| | | |
|---|---|---|
| EP | 0 470 480 | 2/1992 |
| JP | 8-116285 | 5/1996 |
| JP | 10-341382 | 12/1998 |
| JP | 10341382 | 12/1998 |
| JP | 11164218 | 6/1999 |

* cited by examiner

*Primary Examiner*—Sherrie Hsia
(74) *Attorney, Agent, or Firm*—Brinks Hofer Gilson & Lione

(57) ABSTRACT

The present invention realizes a small-size and inexpensive television tuner's intermediate frequency tuning circuit that can be used for both television intermediate frequency signals and FM broadcast signals frequency-converted to 10.7 MHz. The television tuner's intermediate frequency tuning circuit comprises: a parallel tuning circuit to both ends of which a television intermediate frequency signal or an FM broadcast signal frequency-converted to 10.7 MHz is inputted; a series tuning circuit connected in parallel to the parallel tuning circuit; and a switch, connected in parallel to a capacitive element of the series tuning circuit, that is closed when the intermediate frequency signal is inputted, and opened when the FM broadcast signal is inputted, wherein the respective tuning frequencies of the parallel tuning circuit and the series tuning circuit are set to 10.7 MHz or more; when the switch is closed, a parallel tuning frequency produced by the parallel tuning circuit and the series tuning circuit is set to the frequency of the intermediate frequency signal; and when the switch is opened, the parallel tuning frequency is set to 10.7 MHz.

3 Claims, 3 Drawing Sheets

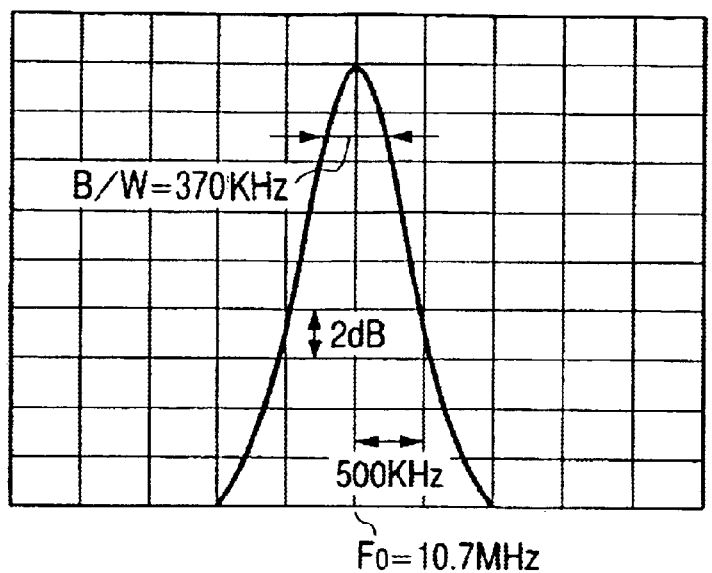
FIG. 6
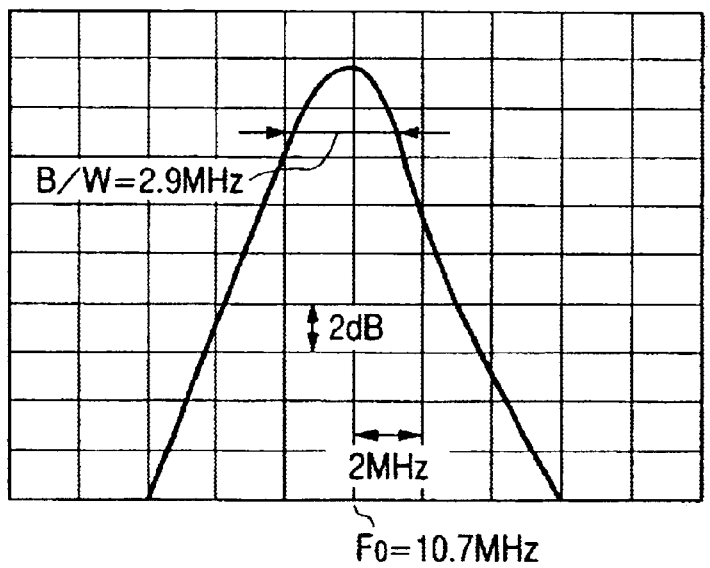
FIG. 7
FIG. 8
PRIOR ART
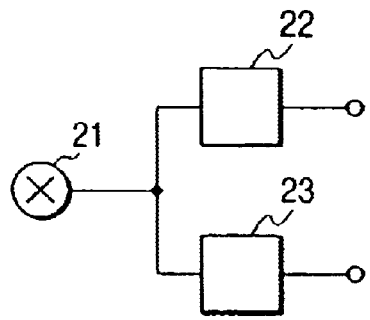

TELEVISION TUNER'S INTERMEDIATE FREQUENCY TUNING CIRCUIT CAPABLE OF RECEIVING FM BROADCAST SIGNALS

BACKGROUND OF THE INVENTION

1. Field of the Invention

The present invention relates to a television tuner's intermediate frequency tuning circuit, and more particularly to a television tuner's intermediate frequency tuning circuit capable of receiving FM broadcast signals.

2. Description of the Prior Art

Referring to FIG. 8, an intermediate frequency tuning circuit of a prior art television tuner is described. A mixing circuit 21 outputs a television intermediate frequency signal or an FM broadcast signal frequency-converted to 10.7 MHz. A first filter 22 and a second filter 23 are connected to the mixing circuit 21. The first filter 22 is constituted by a parallel tuning circuit whose tuning frequency is set to the frequency of a television intermediate frequency signal (center frequency in the U.S. specifications: 43.5 MHz). The second filter 23 is constituted by a ceramic filter whose tuning frequency is set to an intermediate frequency (10.7 MHz) of common FM receivers.

When a television signal is received, a television intermediate frequency signal outputted from the mixing circuit 21 passes through the first filter 22 and is inputted to a circuit (intermediate frequency amplifier, etc.) at the next stage not shown.

When an FM broadcast signal is received, the FM broadcast signal of 10.7 MHz outputted from the mixing circuit 21 passes through the second filter 23 and is inputted to an FM demodulator or the like not shown.

As has been described above, an intermediate frequency tuning circuit of a prior art television tuner has been large in size and expensive because it has two filters, of which one is the second filter 23 for FM intermediate frequency signals that is constituted by a ceramic filter.

SUMMARY OF THE INVENTION

Accordingly, the present invention provides a small-size and inexpensive television tuner's intermediate frequency tuning circuit that can be used for both television intermediate frequency signals and FM broadcast signals frequency-converted to 10.7 MHz.

To solve the above-described problems, the present invention provides a television tuner's intermediate frequency tuning circuit, comprising: a parallel tuning circuit, consisting of a first inductance element and a first capacitive element, to both ends of which a television intermediate frequency signal or an FM broadcast signal frequency-converted to 10.7 MHz is inputted, the both ends being respectively connected to both ends of a load; a series tuning circuit, consisting of a second inductance element and a second capacitive element, connected in parallel to the parallel tuning circuit; and switch means, connected in parallel to the second capacitive element, that is closed when the intermediate frequency signal is inputted, and opened when an FM broadcast signal is inputted, wherein the respective tuning frequencies of the parallel tuning circuit and the series tuning circuit are set to 10.7 MHz or more; when the switch means is closed, a parallel tuning frequency produced by the parallel tuning circuit and the series tuning circuit is set to the frequency of the intermediate frequency signal; and when the switch means is opened, the parallel tuning frequency is set to 10.7 MHz.

The first inductance element is constituted of two first small inductance elements connected in series, and a first voltage is applied to a connection point between the two first small inductance elements; the second inductance element is constituted of two split second small inductance elements, and the second capacitive element is connected between the two second small inductance elements; the switch means is constituted of first and second switch diodes the cathodes of which are connected with each other; when the intermediate frequency signal is inputted, the voltages of the cathodes are dropped below the first voltage, and the first and second switch diodes are turned on; and when the FM broadcast signal is inputted, the voltages of the cathodes are raised above the first voltage, and the first and second switch diodes are turned off.

There are provided a first varactor diode for coupling one end of the parallel tuning circuit to one end of the load, and a second varactor diode for coupling the other end of the parallel tuning circuit to the other end of the load; the anode of the first varactor diode is connected to one end of the parallel tuning circuit, and the anode of the second varactor diode is connected to the other end of the parallel tuning circuit; when the intermediate frequency signal is inputted, the voltages of the cathodes of the first and second varactor diodes are dropped below the first voltage, and the first and second varactor diodes are turned on; and when the FM broadcast signal is inputted, the voltages of the cathodes are raised above the first voltage, and the first and second varactor diodes are turned off.

BRIEF DESCRIPTION OF THE DRAWINGS

Preferred embodiments of the present invention will be described in detail based on the followings, wherein:

FIG. 6 is a drawing showing tuning characteristics at the reception of an FM broadcast signal in a television tuner's intermediate frequency tuning circuit of the present invention;

FIG. 7 is a drawing showing tuning characteristics at the reception of an FM broadcast signal in a television tuner's intermediate frequency tuning circuit of the present invention; and FIG. 8 is a schematic diagram showing the configuration of an intermediate frequency tuning circuit of a prior art television tuner.

DESCRIPTION OF THE PREFERRED EMBODIMENTS

Figure 1:
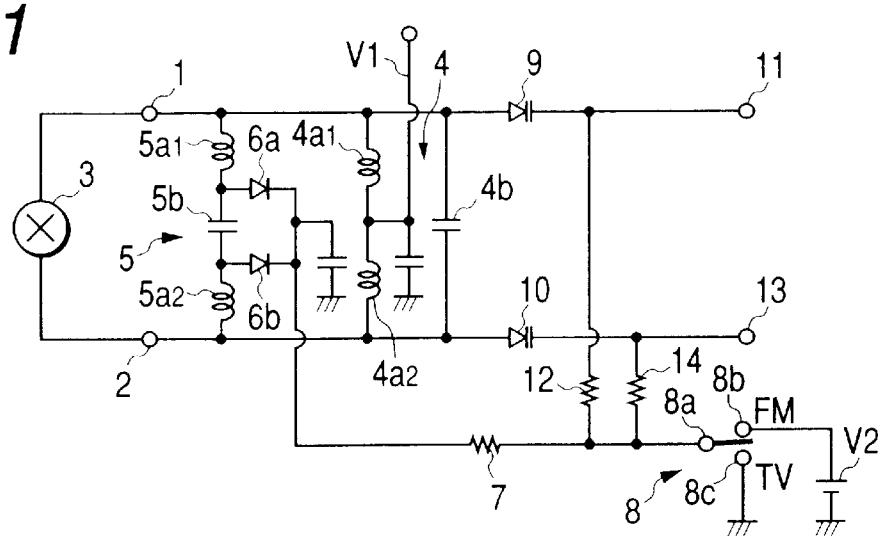
FIG. 1 is a schematic diagram showing the configuration of a television tuner's intermediate frequency tuning circuit of the present invention.

A television tuner's intermediate frequency tuning circuit of the present invention will be described with reference to FIGS. 1 to 7. In FIG. 1, a mixing circuit 3 is connected to input terminals 1 and 2. The mixing circuit 3 outputs a television intermediate frequency signal (TV intermediate frequency signal) or an FM broadcast signal (FM intermediate frequency signal) frequency-converted to 10.7 MHz. The TV intermediate frequency signal and the FM intermediate frequency signal are balance-outputted and inputted between the input terminals 1 and 2.

A parallel tuning circuit 4 and a series tuning circuit 5 are placed in parallel between the input terminals 1 and 2. The parallel tuning circuit 4, which has a first inductance element 4a and a first capacitive element 4b, has a tuning frequency set higher (about 20 MHz) than 10.7 MHz. The first inductance element 4a consists of two first small inductance elements 4a1 and 4a2 connected in series which have a same mutual inductance. A first voltage V1 is applied to a connection point of the first small inductance elements 4a1 and 4a2.

The series tuning circuit 5 consists of two split second small inductance elements 5a1 and 5a2 constituting a second inductance element 5a, and a second capacitive element 5b, and a second capacitive element 5b is connected between the two second small inductance elements 5a1 and 5a2. The series tuning circuit 5 also has a tuning frequency set higher (about 30 MHz) than 10.7 MHz.

A first switch diode 6a and a second switch diode 6b of switch means 6 are connected in series across the second capacitive element 5b. The anode of the first switch diode 6a is connected to one end of the second capacitive element 5b and the anode of the second switch diode 6b is connected to another end of the second capacitive element 5b. As a result, the anodes of the first and second switch diodes 6a and 6b are DC connected to the connection point of the first small inductance elements 4a1 and 4a2 connected in series.

The cathode of the first switch diode 6a and the cathode of the second switch diode 6b are connected to each other and connected to a moving contact 8a of switching means 8 through a resistor 7. A second voltage V2 higher than a first voltage is supplied to one fixed contact 8b of the switching means 8 and another fixed contact 8c is grounded. The moving contact 8a is connected to the fixed contact 8c when a television signal is received, that is, when a TV intermediate frequency signal is outputted from the mixing circuit 3; when an FM broadcast signal is received, that is, when an FM intermediate frequency signal is outputted from the mixing circuit 3, the moving contact 8a is connected to the fixed contact 8b.

The anode of a first varactor diode 9 is connected to one end of the parallel tuning circuit 4 and the anode of a second varactor diode 10 is connected to another end thereof. As a result, the anodes of the first and second varactor diodes 9 and 10 are DC connected to the connection point of the first small inductance elements 4a1 and 4a2 connected in series. The cathode of the first varactor diode 9 is connected to an output terminal 11 and connected to the moving contact 8a of the switching means 8 through a resistor 12. The cathode of the second varactor diode 10 is connected to an output terminal 13 and connected to the moving contact 8a through a resistor 14.

Figure 2:
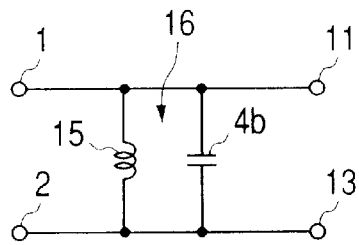
FIG. 2 is a drawing showing an equivalent circuit at the reception of television signals of a television tuner's intermediate frequency tuning circuit of the present invention.

In the above-described configuration, when a television signal is received, the first and second switch diodes 6a and 6b go on, and both ends of the second capacitive element 5b are short-circuited, while the varactor diodes of the first and second varactor diodes 9 and 10 go on. As a result, an equivalent circuit of FIG. 2 is a parallel tuning circuit 16 with the first capacitive element 4b and an inductance element 15 connected in parallel. A load circuit (not shown) is connected between the output terminals 11 and 13.

The inductance element 15 is equivalent to a parallel circuit consisting of the first inductance element 4a and the second inductance element 5a. A parallel tuning frequency at this time is set to the frequency of a TV intermediate frequency signal. For example, the U.S. specifications define 43.5 MHz as the parallel tuning frequency.

Figure 3:
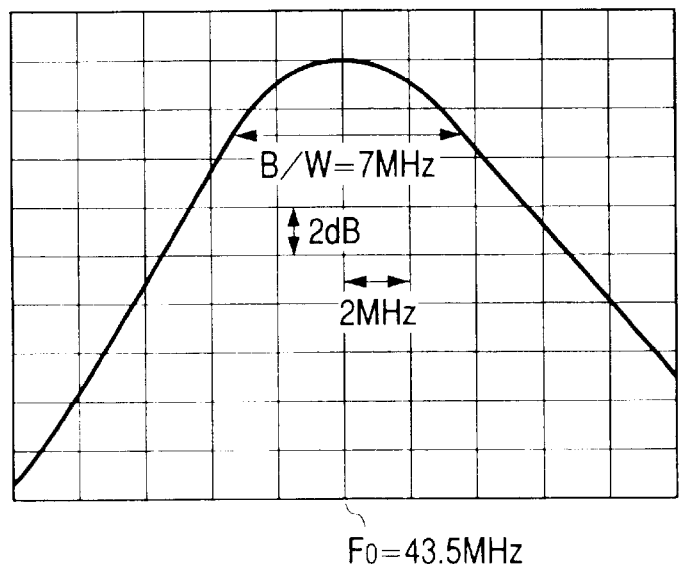
FIG. 3 is a drawing showing tuning characteristics at the reception of a television signal in a television tuner's intermediate frequency tuning circuit of the present invention.

Tuning characteristics indicating Q of the parallel tuning circuit 16, which depend on the output impedance of the mixing circuit 3 and the input impedance of the load circuit connected to the next stage, indicate a band width of 7 MHz (band width at a point 3 dB below a peak) suitable for transmission of a TV intermediate frequency signal, as shown in FIG. 3.

Figure 4:
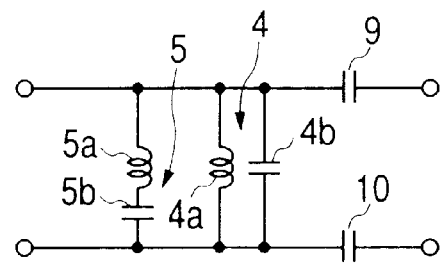
FIG. 4 is a drawing showing an equivalent circuit at the reception of an FM broadcast signal in a television tuner's intermediate frequency tuning circuit of the present invention.

On the other hand, when an FM broadcast signal is received, the first and second switch diodes 6a and 6b go off and the first and second varactor diodes 9 and 10 go off. As a result, there is obtained an equivalent circuit of FIG. 1 as shown in FIG. 4 in which the first and second varactor diodes 9 and 10 deliver proper capacitance values determined by the first and second voltages.

Figure 5A:
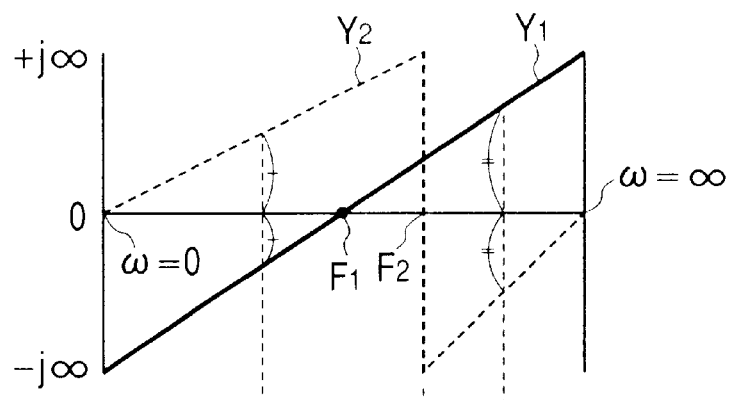
FIG. 5 is a drawing showing admittance characteristics at the reception of an FM broadcast signal in a television tuner's intermediate frequency tuning circuit of the present invention.

Herein, if the tuning frequency of the parallel tuning circuit 4 is F1 and the tuning frequency of the series tuning circuit 5 is F2, their admittance characteristics are shown as a solid line Y1 and a dotted line Y2 of FIG. 5, respectively.

Figure 5B:
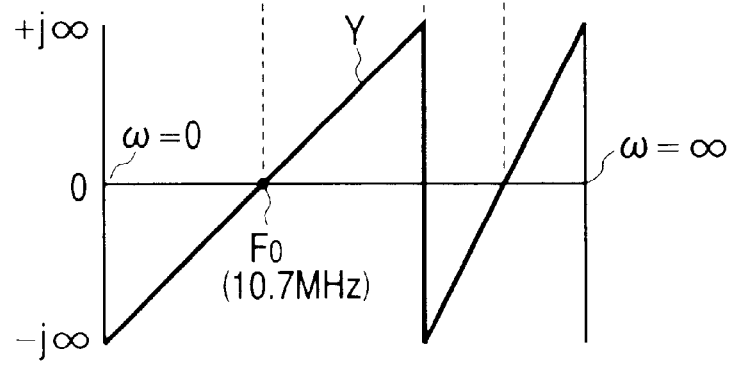

Accordingly, if the admittances Y1 and Y2 are added in FIG. 5, a total admittance Y is obtained and shown as a solid line Y of FIG. 5B, which shows that an admittance of 0 appears at the point of a frequency F0 lower than the tuning frequencies F1 and F2. This position represents a parallel tuning frequency produced by the parallel tuning circuit 4 and the series tuning circuit 5; the parallel tuning frequency is set to 10.7 MHz.

Since, at 10.7 MHz, the series tuning circuit 5 becomes equivalently capacitive, it is added to the first capacitive element 4b, so that a tuning capacitance increases. Furthermore, since the first and second varactor diodes 9 and 10 deliver proper capacitance values, the influence of input impedance of the load circuit of the next stage becomes small, tuning characteristics indicating Q becomes steep as shown in FIG. 6, and a band width becomes about 370 KHz. Consequently, immunity can be increased to interference from other FM broadcast signals having adjacent frequencies.

In FIG. 1, the first varactor diodes 9 and 10 may be deleted to directly couple the input terminal 1 and the output terminal 11 and likewise the input terminal 2 and the output terminal 13. In this case, since the load circuit at the next stage is directly coupled to the parallel tuning circuit 4 and the series tuning circuit 5, the circuit Q becomes slightly small, and as shown in FIG. 7, tuning characteristics having a bandwidth of about 2.9 MHz are obtained. Also in this case, the narrowed band width is suitable for receiving FM broadcast signals.

Furthermore, grounding one input terminal 2 and one output terminal 13 constitutes an unbalanced IF tuning circuit. In this case, not only the second switch diode and the second varactor diode 10 become unnecessary, but also the first inductance element 4a and the second inductance element need not be split to two second small inductance elements. However, the wiring for applying voltage to the first switch diode and the first varactor diode must be changed.

As has been described above, a television tuner's intermediate frequency tuning circuit of the present invention comprises: a parallel tuning circuit to both ends of which a television intermediate frequency signal or an FM broadcast signal frequency-converted to 10.7 MHz is inputted; a series tuning circuit connected in parallel to the parallel tuning circuit; and switch means, connected in parallel to a second capacitive element of the series tuning circuit, that is closed when the intermediate frequency signal is inputted, and opened when the FM broadcast signal is inputted, wherein the respective tuning frequencies of the parallel tuning circuit and the series tuning circuit are set to 10.7 MHz or more; when the switch means is closed, a parallel tuning frequency produced by the parallel tuning circuit and the series tuning circuit is set to the frequency of the intermediate frequency signal; and when the switch means is opened, the parallel tuning frequency is set to 10.7 MHz. With this construction, by opening or closing the switch means, the circuit can be tuned to an FM intermediate frequency signal frequency or a normal television intermediate frequency signal frequency of 10.7 MHz. Hence, the circuit can be simplified and constructed at a low cost. Where the circuit is tuned to an FM intermediate frequency signal frequency, since the series tuning circuit becomes capacitive, tuning characteristics become steep, increasing immunity to interference from other FM broadcast signals having adjacent frequencies.

A first inductance element is constituted of two first small inductance elements, and a first voltage is applied to a connection point between the two first small inductance elements; a second inductance element is constituted of two split second small inductance elements, and a second capacitive element is connected between the two second small inductance elements; the switch means is constituted of first and second switch diodes the cathodes of which are connected with each other; when the intermediate frequency signal is inputted, the voltages of the cathodes are dropped below the first voltage, and the first and second switch diodes are turned on; and when the FM broadcast signal is inputted, the voltages of the cathodes are raised above the first voltage, and the first and second switch diodes are turned off. With this construction, tuning frequencies are easily switched and a balanced circuit can be formed.

There are provided a first varactor diode for coupling one end of the parallel tuning circuit to one end of a load, and a second varactor diode for coupling the other end of the parallel tuning circuit to the other end of the load; when the intermediate frequency signal is inputted, the voltages of the cathodes of the first and second varactor diodes are dropped below the first voltage, and the first and second varactor diodes are turned on; and when the FM broadcast signal is inputted, the voltages of the cathodes are raised above the first voltage, and the first and second varactor diodes are turned off. With this construction, when the FM broadcast signal is received, the first and second varactor diodes have proper capacitance values and the coupling with the load circuit becomes loose so that the tuning characteristics become steeper.

What is claimed is:

1. A television tuner's intermediate frequency tuning circuit, comprising:
   a parallel tuning circuit, comprising a first inductance element and a first capacitive element, to both ends of which one of a television intermediate frequency signal and an FM broadcast signal frequency-converted to 10.7 MHz is inputted, the both ends being respectively connected to both ends of a load;
   a series tuning circuit, comprising a second inductance element and a second capacitive element, connected in parallel to the parallel tuning circuit; and
   a switch, connected in parallel to the second capacitive element, that is closed when the intermediate frequency signal is inputted, and opened when the FM broadcast signal is inputted, wherein:
      respective tuning frequencies of the parallel tuning circuit and the series tuning circuit are set to at least 10.7 MHz;
      when the switch is closed, a parallel tuning frequency produced by the parallel tuning circuit and the series tuning circuit is set to a frequency of the intermediate frequency signal; and
      when the switch is opened, the parallel tuning frequency is set to 10.7 MHz.

2. The television tuner's intermediate frequency tuning circuit according to claim 1, wherein:
   the first inductance element comprises two first small inductance elements connected in series, and a first voltage is applied to a connection point between the two first small inductance elements;
   the second inductance element comprises two split second small inductance elements, and the second capacitive element is connected between the two second small inductance elements;
   the switch comprises first and second switch diodes having cathodes connected with each other;
   when the intermediate frequency signal is inputted, the voltages of the cathodes are dropped below the first voltage, and the first and second switch diodes are turned on; and
   when the FM broadcast signal is inputted, voltages of the cathodes are raised above the first voltage, and the first and second switch diodes are turned off.

3. The television tuner's intermediate frequency tuning circuit according to claim 2, wherein:
   there are provided a first varactor diode to couple one end of the parallel tuning circuit to one end of the load, and a second varactor diode to couple the other end of the parallel tuning circuit to the other end of the load;
   an anode of the first varactor diode is connected to the one end of the parallel tuning circuit, and an anode of the second varactor diode is connected to the other end of the parallel tuning circuit;
   when the intermediate frequency signal is inputted, voltages of cathodes of the first and second varactor diodes are dropped below the first voltage, and the first and second varactor diodes are turned on; and
   when the FM broadcast signal is inputted, the voltages of the cathodes are raised above the first voltage, and the first and second varactor diodes are turned off.

* * * * *